US010910232B2

(12) United States Patent
Kim et al.

(10) Patent No.: US 10,910,232 B2
(45) Date of Patent: Feb. 2, 2021

(54) COPPER PLASMA ETCHING METHOD AND MANUFACTURING METHOD OF DISPLAY PANEL

(71) Applicants: Samsung Display Co., Ltd., Yongin-si (KR); Korea University Research and Business Foundation, Sejong Campus, Sejong (KR)

(72) Inventors: Sang Gab Kim, Seoul (KR); MunPyo Hong, Seongnam-si (KR); Hyun Min Cho, Hwaseong-si (KR); Seong Yong Kwon, Andong-si (KR); Ho Won Yoon, Seoul (KR)

(73) Assignees: SAMSUNG DISPLAY CO., LTD., Gyeonggi-Do (KR); KOREA UNIVERSITY RESEARCH AND BUSINESS FOUNDATION, SEJONG CAMPUS, Sejong (KR)

( * ) Notice: Subject to any disclaimer, the term of this patent is extended or adjusted under 35 U.S.C. 154(b) by 0 days.

(21) Appl. No.: 16/106,739

(22) Filed: Aug. 21, 2018

(65) Prior Publication Data

US 2019/0103287 A1   Apr. 4, 2019

(30) Foreign Application Priority Data

Sep. 29, 2017   (KR) .......................... 10-2017-0127794

(51) Int. Cl.
*H01L 21/3213* (2006.01)
*C23F 3/04* (2006.01)
(Continued)

(52) U.S. Cl.
CPC .......... *H01L 21/32136* (2013.01); *C23F 3/04* (2013.01); *C23F 4/00* (2013.01);
(Continued)

(58) Field of Classification Search
CPC ..... C23F 3/04; C23F 4/00; H01J 37/00; H01J 37/32192; H01J 37/32688;
(Continued)

(56) References Cited

U.S. PATENT DOCUMENTS 5,736,002 A * 4/1998 Allen .................. C23F 4/00
257/E21.305
9,570,320 B2 * 2/2017 Shen ................. H01L 21/32136
(Continued)

FOREIGN PATENT DOCUMENTS

JP      1994021004 A    1/1994
JP      2793472 A1      9/1998
(Continued)

OTHER PUBLICATIONS

Ajay Jain et al., "Thermal dry-etching of copper using hydrogen peroxide and hexafluoroacetylacetone", Thin Solid Films, Nov. 15, 1995, pp. 51-56, vol. 269, Issues 1-2.
(Continued)

*Primary Examiner* — Lan Vinh
(74) *Attorney, Agent, or Firm* — Cantor Colburn LLP

(57) ABSTRACT

A copper plasma etching method according an exemplary embodiment includes: placing a substrate on a susceptor in a process chamber of a plasma etching apparatus; supplying an etching gas that include hydrogen chloride into the process chamber; plasma-etching a conductor layer that include copper in the substrate; and maintaining a temperature of the susceptor at 10° C. or less during the plasma-etching.

20 Claims, 10 Drawing Sheets

(51) Int. Cl.
*H01L 21/441* (2006.01)
*H01L 21/3105* (2006.01)
*H01L 21/02* (2006.01)
*H05K 3/06* (2006.01)
*H01L 23/532* (2006.01)
*H01L 29/786* (2006.01)
*H01L 29/49* (2006.01)
*H01L 21/311* (2006.01)
*H01J 37/00* (2006.01)
*C23F 4/00* (2006.01)

(52) U.S. Cl.
CPC ........ *H01J 37/00* (2013.01); *H01L 21/02063* (2013.01); *H01L 21/31053* (2013.01); *H01L 21/31122* (2013.01); *H01L 21/441* (2013.01); *H01L 23/53242* (2013.01); *H01L 29/4908* (2013.01); *H01L 29/78606* (2013.01); *H01L 29/78693* (2013.01); *H05K 3/062* (2013.01); *H01L 23/53228* (2013.01)

(58) Field of Classification Search
CPC ......... H01L 21/02063; H01L 21/31053; H01L 21/31122; H01L 21/32136; H01L 21/441; H01L 23/53228; H01L 23/53242; H01L 29/4908; H01L 29/78606; H01L 29/78693; H05K 3/062
USPC ....... 438/706, 710, 712, 714, 717, 719, 720, 438/723, 736
See application file for complete search history.

(56) References Cited

U.S. PATENT DOCUMENTS

| | | | |
|---|---|---|---|
| 2006/0014394 A1* | 1/2006 | Kulkarni | H01L 21/32136 438/710 |
| 2006/0057502 A1 | 3/2006 | Okada et al. | |
| 2006/0084271 A1 | 4/2006 | Yang et al. | |
| 2006/0091355 A1 | 5/2006 | Itano et al. | |
| 2006/0109881 A1 | 5/2006 | Kwak et al. | |
| 2006/0124956 A1 | 6/2006 | Peng | |
| 2006/0148234 A1 | 7/2006 | Chen et al. | |
| 2006/0154393 A1 | 7/2006 | Doan et al. | |
| 2006/0234499 A1 | 10/2006 | Kodera et al. | |
| 2006/0238573 A1 | 10/2006 | Hu et al. | |
| 2006/0261489 A1 | 11/2006 | Takemoto et al. | |
| 2006/0270229 A1 | 11/2006 | Corderman et al. | |
| 2006/0283833 A1 | 12/2006 | Lee et al. | |
| 2006/0289203 A1 | 12/2006 | Oda | |
| 2007/0001295 A1 | 1/2007 | Cho et al. | |
| 2007/0004066 A1 | 1/2007 | Wuu et al. | |
| 2007/0024766 A1 | 2/2007 | Song et al. | |
| 2007/0072408 A1 | 3/2007 | Enomoto et al. | |
| 2007/0082475 A1 | 4/2007 | Park | |
| 2007/0108063 A1 | 5/2007 | Nakada et al. | |
| 2007/0108514 A1 | 5/2007 | Inoue et al. | |
| 2007/0120263 A1 | 5/2007 | Gabric et al. | |
| 2007/0158632 A1 | 7/2007 | Ho | |
| 2007/0224359 A1 | 9/2007 | Burin et al. | |
| 2007/0252198 A1 | 11/2007 | Chung et al. | |
| 2007/0277866 A1 | 12/2007 | Sander et al. | |
| 2008/0003701 A1 | 1/2008 | Chen et al. | |
| 2008/0036045 A1 | 2/2008 | Chen et al. | |
| 2008/0081398 A1 | 4/2008 | Lee et al. | |
| 2008/0093221 A1 | 4/2008 | Basol | |
| 2008/0099765 A1 | 5/2008 | Kim et al. | |
| 2008/0113463 A1 | 5/2008 | Liu et al. | |
| 2008/0124924 A1 | 5/2008 | Naik | |
| 2008/0132059 A1 | 6/2008 | Noguchi et al. | |
| 2008/0135868 A1 | 6/2008 | Okagawa et al. | |
| 2008/0142941 A1 | 6/2008 | Yew et al. | |
| 2008/0187764 A1 | 8/2008 | Jung et al. | |
| 2008/0203571 A1 | 8/2008 | Jungnickel et al. | |
| 2008/0206562 A1 | 8/2008 | Stucky et al. | |
| 2008/0217715 A1 | 9/2008 | Park et al. | |
| 2008/0217775 A1 | 9/2008 | Pai et al. | |
| 2008/0258306 A1 | 10/2008 | Chang et al. | |
| 2008/0277678 A1 | 11/2008 | Li et al. | |
| 2008/0284023 A1 | 11/2008 | Kim | |
| 2008/0311434 A1 | 12/2008 | Rey-Mermet et al. | |
| 2009/0004864 A1 | 1/2009 | Kim et al. | |
| 2009/0008777 A1 | 1/2009 | Lin et al. | |
| 2009/0014324 A1* | 1/2009 | Kawaguchi | H01L 21/68742 204/298.35 |
| 2009/0057904 A1 | 3/2009 | Lee | |
| 2009/0102052 A1 | 4/2009 | Ryu | |
| 2009/0142924 A1 | 6/2009 | Hu et al. | |
| 2009/0146304 A1 | 6/2009 | Son et al. | |
| 2009/0159976 A1 | 6/2009 | Goldbach et al. | |
| 2009/0166873 A1 | 7/2009 | Yang et al. | |
| 2009/0170305 A1 | 7/2009 | West et al. | |
| 2009/0183992 A1 | 7/2009 | Fredenberg et al. | |
| 2009/0205967 A1 | 8/2009 | Fredenberg et al. | |
| 2009/0217969 A1 | 9/2009 | Matsushima et al. | |
| 2009/0218233 A1 | 9/2009 | Fredenberg et al. | |
| 2009/0221152 A1 | 9/2009 | Dietz et al. | |
| 2009/0250260 A1 | 10/2009 | Kang | |
| 2009/0258255 A1 | 10/2009 | Terashima et al. | |
| 2010/0022057 A1 | 1/2010 | Chung et al. | |
| 2010/0032760 A1 | 2/2010 | Choi et al. | |
| 2010/0045145 A1 | 2/2010 | Tsuda | |
| 2010/0120242 A1 | 5/2010 | Chevacharoenkul et al. | |
| 2010/0164062 A1 | 7/2010 | Wang et al. | |
| 2010/0170563 A1 | 7/2010 | Xue | |
| 2010/0171173 A1 | 7/2010 | Hsieh | |
| 2010/0200912 A1 | 8/2010 | Hsieh | |
| 2010/0244251 A1 | 9/2010 | Torazawa et al. | |
| 2010/0263246 A1 | 10/2010 | Oh et al. | |
| 2010/0264538 A1 | 10/2010 | Swinnen et al. | |
| 2010/0270552 A1 | 10/2010 | Song et al. | |
| 2010/0291475 A1 | 11/2010 | Li | |
| 2011/0027408 A1 | 2/2011 | Suzuki et al. | |
| 2011/0089141 A1 | 4/2011 | Tanaka et al. | |
| 2011/0101392 A1 | 5/2011 | Park et al. | |
| 2011/0120969 A1 | 5/2011 | Lin | |
| 2011/0123930 A1 | 5/2011 | Lin | |
| 2011/0123931 A1 | 5/2011 | Lin | |
| 2011/0139243 A1 | 6/2011 | Shim et al. | |
| 2011/0146909 A1 | 6/2011 | Shih et al. | |
| 2011/0195541 A1 | 8/2011 | Machii et al. | |
| 2011/0211604 A1 | 9/2011 | Roscher | |
| 2011/0214265 A1 | 9/2011 | Tsuda | |
| 2011/0272287 A1 | 11/2011 | Duch et al. | |
| 2011/0291120 A1 | 12/2011 | Tak et al. | |
| 2012/0037935 A1 | 2/2012 | Yang | |
| 2012/0037983 A1 | 2/2012 | Hshieh | |
| 2012/0044220 A1 | 2/2012 | Lee et al. | |
| 2012/0098124 A1 | 4/2012 | Wu et al. | |
| 2012/0103588 A1 | 5/2012 | Kim et al. | |
| 2012/0132529 A1 | 5/2012 | Zekry et al. | |
| 2012/0152295 A1 | 6/2012 | Matus et al. | |
| 2012/0156815 A1 | 6/2012 | Huang et al. | |
| 2012/0217498 A1 | 8/2012 | Yamanaka et al. | |
| 2012/0305966 A1 | 12/2012 | Shin | |
| 2013/0001752 A1 | 1/2013 | Wu et al. | |
| 2013/0004716 A1 | 1/2013 | Koh et al. | |
| 2013/0014813 A1 | 1/2013 | Wang et al. | |
| 2013/0026462 A1 | 1/2013 | Takei et al. | |
| 2013/0037793 A1* | 2/2013 | Pan | H01L 29/66969 257/43 |
| 2013/0049107 A1 | 2/2013 | So | |
| 2013/0052475 A1 | 2/2013 | Kim et al. | |
| 2013/0068721 A1 | 3/2013 | Park et al. | |
| 2013/0083492 A1 | 4/2013 | Kim et al. | |
| 2013/0119518 A1 | 5/2013 | Kitai et al. | |
| 2013/0187254 A1 | 7/2013 | Ma | |
| 2013/0217225 A1 | 8/2013 | Hayakawa et al. | |
| 2013/0234820 A1 | 9/2013 | Yoo et al. | |
| 2013/0249382 A1 | 9/2013 | Lee et al. | |
| 2013/0270118 A1 | 10/2013 | Park et al. | |
| 2013/0335822 A1 | 12/2013 | Yeh et al. | |
| 2013/0341181 A1 | 12/2013 | Park et al. | |
| 2014/0014942 A1 | 1/2014 | O'Neill et al. | |

(56) References Cited

U.S. PATENT DOCUMENTS

| | | |
|---|---|---|
| 2014/0027163 A1 | 1/2014 | Min et al. |
| 2014/0037963 A1 | 2/2014 | Song |
| 2014/0116507 A1 | 5/2014 | Shim et al. |
| 2014/0151095 A1 | 6/2014 | Cho et al. |
| 2014/0175655 A1 | 6/2014 | Chen et al. |
| 2014/0182904 A1 | 7/2014 | Park et al. |
| 2014/0183726 A1 | 7/2014 | Lee et al. |
| 2014/0199831 A1 | 7/2014 | Hotta et al. |
| 2014/0262755 A1 | 9/2014 | Deshmukh et al. |
| 2014/0291753 A1 | 10/2014 | Hsieh |
| 2014/0339092 A1 | 11/2014 | Berkei et al. |
| 2014/0339537 A1 | 11/2014 | Bae |
| 2014/0339581 A1 | 11/2014 | Kwon et al. |
| 2014/0349035 A1 | 11/2014 | Cho et al. |
| 2014/0349171 A1 | 11/2014 | Kim et al. |
| 2014/0357053 A1 | 12/2014 | Sun et al. |
| 2015/0016067 A1 | 1/2015 | Song et al. |
| 2015/0017482 A1 | 1/2015 | Lee et al. |
| 2015/0028263 A1 | 1/2015 | Wang et al. |
| 2015/0086462 A1 | 3/2015 | Such et al. |
| 2015/0087156 A1 | 3/2015 | Kamimura et al. |
| 2015/0093904 A1 | 4/2015 | Yi et al. |
| 2015/0099369 A1* | 4/2015 | Deshmukh ........ H01L 21/32135 438/720 |
| 2015/0102498 A1 | 4/2015 | Enicks et al. |
| 2015/0147842 A1 | 5/2015 | Matus et al. |
| 2015/0183152 A1 | 7/2015 | Mitamura |
| 2015/0207018 A1 | 7/2015 | Yang |
| 2015/0225645 A1 | 8/2015 | Kamimura et al. |
| 2015/0228533 A1 | 8/2015 | Hwang et al. |
| 2015/0267112 A1 | 9/2015 | Dory et al. |
| 2015/0287909 A1 | 10/2015 | Liu et al. |
| 2015/0290624 A1 | 10/2015 | Sharma et al. |
| 2015/0314579 A1 | 11/2015 | Hong et al. |
| 2015/0322277 A1 | 11/2015 | Spatz et al. |
| 2015/0340422 A1 | 11/2015 | Lee et al. |
| 2015/0348706 A1 | 12/2015 | Sano et al. |
| 2015/0357089 A1 | 12/2015 | Oh et al. |
| 2015/0380271 A1 | 12/2015 | Chen et al. |
| 2016/0024676 A1 | 1/2016 | Willigan et al. |
| 2016/0056271 A1 | 2/2016 | Liaw |
| 2016/0074833 A1 | 3/2016 | O'Brien et al. |
| 2016/0087075 A1 | 3/2016 | Zhang et al. |
| 2016/0104630 A1* | 4/2016 | Shen ................ H01L 21/32133 438/694 |
| 2016/0111329 A1 | 4/2016 | Zhang et al. |
| 2016/0111368 A1 | 4/2016 | Zhang et al. |
| 2016/0114503 A1 | 4/2016 | Suzuki et al. |
| 2016/0129853 A1 | 5/2016 | Kulas et al. |
| 2016/0133650 A1 | 5/2016 | Sugawara |
| 2016/0136952 A1 | 5/2016 | Ishikura et al. |
| 2016/0163888 A1 | 6/2016 | Reddy |
| 2016/0172574 A1 | 6/2016 | Ikeuchi et al. |
| 2016/0181489 A1 | 6/2016 | Matsui et al. |
| 2016/0189956 A1 | 6/2016 | Hansen et al. |
| 2016/0190064 A1 | 6/2016 | Lai et al. |
| 2016/0203918 A1 | 7/2016 | Hinsch et al. |
| 2016/0204126 A1 | 7/2016 | Amano |
| 2016/0211413 A1 | 7/2016 | Park et al. |
| 2016/0212844 A1 | 7/2016 | Cojocaru et al. |
| 2016/0218035 A1 | 7/2016 | Yang et al. |
| 2016/0240377 A1 | 8/2016 | Yu et al. |
| 2016/0268319 A1 | 9/2016 | Long et al. |
| 2016/0274302 A1 | 9/2016 | Kuo et al. |
| 2016/0276283 A1 | 9/2016 | Zhang et al. |
| 2016/0284594 A1 | 9/2016 | Zhang et al. |
| 2016/0293542 A1 | 10/2016 | Hotta et al. |
| 2016/0304341 A1 | 10/2016 | Bright et al. |
| 2016/0312115 A1 | 10/2016 | Starick et al. |
| 2016/0315042 A1 | 10/2016 | Yoon et al. |
| 2016/0318011 A1 | 11/2016 | Hosseinifar et al. |
| 2016/0329457 A1 | 11/2016 | Forrest et al. |
| 2016/0343655 A1 | 11/2016 | Majeed et al. |
| 2016/0351726 A1 | 12/2016 | Wang et al. |
| 2016/0359111 A1 | 12/2016 | Kim et al. |
| 2017/0018626 A1 | 1/2017 | Hoffman et al. |
| 2017/0025493 A1 | 1/2017 | Xu |
| 2017/0029272 A1 | 2/2017 | Ren |
| 2017/0043331 A1 | 2/2017 | Verma et al. |
| 2017/0053908 A1 | 2/2017 | Hoffman |
| 2017/0062239 A1 | 3/2017 | Yoo et al. |
| 2017/0068045 A1 | 3/2017 | Ju et al. |
| 2017/0084376 A1 | 3/2017 | Kubota |
| 2017/0084751 A1 | 3/2017 | Kato |
| 2017/0084769 A1 | 3/2017 | Lee et al. |
| 2017/0104079 A1 | 4/2017 | Xiao et al. |
| 2017/0125305 A1 | 5/2017 | Zhou |
| 2017/0125329 A1 | 5/2017 | Lewandowski et al. |
| 2017/0140989 A1 | 5/2017 | Tabuchi et al. |
| 2017/0141258 A1 | 5/2017 | McFarland et al. |
| 2017/0147116 A1 | 5/2017 | Lee et al. |
| 2017/0149054 A1 | 5/2017 | Fang et al. |
| 2018/0005881 A1* | 1/2018 | Lianto ............... H01L 21/76879 |

FOREIGN PATENT DOCUMENTS

| | | |
|---|---|---|
| KR | 1020040033619 A | 4/2004 |
| KR | 1020140051090 A | 4/2014 |
| KR | 1020150128965 A | 11/2015 |

OTHER PUBLICATIONS

Amdreas Bertz et al., "Effects of the biasing frequency on RIE of Cu in a Cl2-based discharge", Applied Surface Science, Oct. 2, 1995, pp. 147-151, vol. 91, Issues 1-4.

B.J. Howard et al., "Reactive ion etching of copper in SiCl4-based plasmas", Appl. Phys, Aug. 19, 1991, pp. 914-916, vol. 59, No. 8.

B.J. Howard et al., "Reactive ion etching of copper with BCl3 and SiCl4", Plasma diagnostics and patterning, J. Vac. Sci. Technol. A, Jul./Aug. 1994, pp. 1259-1264, vol. 12, No. 4.

Christoph Steinbruchel, "Patterning of copper for multilevel metallization: reactive ion etching and chemical-mechanical polishing", Applied Surface Science, Oct. 2, 1995, pp. 139-146, vol. 91, Issues 1-4.

Fangyu Wu et al., "2. Low-Temperature Etching of Cu by Hydrogen-Based Plasmas", ACS Applied materals & Interfaces, Publication Date (Web): Jul. 16, 2010, pp. 2175-2179, vol. 2, No. 8.

G.C. Schwartz et al., "Reactive Ion Etching of Copper Films", J. Electrochem. Soc, 1983, Accelerated Brief Communication, Aug. 1983, pp. 1777-1779, vol. 130, No. 8.

H. Hosol et al., "Lower-temperature plasma etching of Cu films using infrared radiation", Appl. Phys. Lett, Nov. 8, 1993, pp. 2703-2704, vol. 63, No. 19.

H. Miyazaki et al., "Copper dry etching with precise wafer-temperature control using Cl2 gas as a single reactant", Journal of Vacuum Science & Technology B, Published Online: Jun. 4, 1998, pp. 237-240, vol. 15, No. 2.

H. Miyazaki et al., "Copper dry etching with precise wafer-temperature control using Cl2 gas as a single reactant", Journal of Vacuum Science & Technology, Published Online: Jun. 4, 1998, p. 237-240, vol. 15, Issue 2.

J. Torres, "Advanced copper interconnections for silicon CMOS technologies", Applied Surface Science, Oct. 2, 1995, pp. 112-123, vol. 91, Issues 1-4.

J.W. Lee et al., "Copper Dry Etching with Cl2/Ar Plasma Chemistry", Journal of the Electrochmical Society, Jul. 1998, pp. 2585-2589, vol. 145, No. 7.

Kang-Sik Choi et al., "Low Temperature Copper Etching Using an Inductively Coupled Plasma with Ultraviolet Light Irradiation", Journal of the Electrochmical Society, Mar. 1998, pp. L37-L39, vol. 145, No. 3.

Kazuhide Ohno et al., "Effect of Temperature on Dry Etching of Copper Films in Chlorinated Gases", Extended Abstracts of the 21st Conference on Solid State Devices and Materials, 1989, pp. 157-160, Tokyo.

Kazuhide Ohno et al., "High Rate Reactive Ion Etching of Copper Films in SiCl4, N2, Cl2 and NH3 Mixture", Extended Abstracts of the 22nd (1990 International) Conference on Solid State Devices and Materials, 1990, pp. 215-218, Sendai, Japan.

(56) References Cited

OTHER PUBLICATIONS

Kazuhide Ohno et al., "Reactive Ion Etching of Copper Films in a SiCl4, N2, Cl2, and NH 3 Mixture", J. Electrochem. Soc., Dec. 1996, vol. 143, No. 12.

Kazuhide Ohno et al., "Reactive Ion Etching of Copper Films in SiCl4 and N2 Mixture", Japanese Journal of Applied Physics, Jun. 1989, pp. L1070-L1072, vol. 28, No. 6.

Kyung Hwan Jang et al., "Etching of Copper Films for Thin Film Transistor Liquid Crystal Display using Inductively Coupled Chlorine-Based Plasmas", Japanese Journal of Applied Physics, Published Dec. 9, 2004, pp. 8300-8303, vol. 43, No. 12.

Myoung Seok Kwon et al., "Reaction Characteristics between Cu Thin Film and RF Inductively Coupled Cl2 Plasma without/with UV Irradiation", Japanese Journal of Applied Physics, 1998, pp. 4103-4108, vol. 37.

P. Markondeya Raj et al., "Zero-Undercut" Semi-Additive Copper Patterning—A Breakthrough for Ultrafine-line RDL Lithographic Structures and Precision RF Thinfilm Passives, 2015 IEEE 65th Electronic Components and Technology Conference (ECTC), Jul. 2015, pp. 402-405.

P.A. Tamirisa et al., "Plasma etching of copper films at low temperature", Journal Microelectronic Engineering, Jan. 2007, pp. 105-108, vol. 84, Issue 1.

Richard Steger et al., "Chemical vapor etching of copper using oxygen and 1,1,1,5,5,5-hexafluoro-2,4-pentanedione", Thin Solid Films, Mar. 1999, pp. 221-229, vol. 342, Issues 1-2.

Sangheon Lee et al., "A New Hydrogen Chloride Plasma-Based Copper Etching Process", Japanese Journal of Applied Physics, 2002, pp. 7345-7352, vol. 41, Part 1, No. 12.

Sung-Kwon Lee et al., "Reactive Ion Etching Mechanism of Copper Film in Chlorine-based Electron Cyclotron Resonance Plasma", Japanese Journal of Applied Physics, Jan. 1997, pp. 50-55, vol. 36.

Sun-Kwon Lee et al., "Reactive Ion Etching Mechanism of Copper Film in Chlorine-based Electron Cyclotron Resonance Plasma", Japanese Journal of Applied Physics, 1997, pp. 50-55, vol. 36.

Tae-Seop Choi et al., "Chemical Etching and Patterning of Copper, Silver, and Gold Films at Low Temperatures", ECS Journal of Solid State Science and Technology, Published Oct. 29, 2014, pp. N3084-N3093, vol. 4, Issue 1.

Tae-Seop Choi et al., "Low Temperature Cu Etching Using CH4-Based Plasmas", ECS Journal of Solid State Science and Technology, Published Oct. 12, 2013, pp. 506-517, vol. 2, issue 11.

TH. Kruck et al., "Low-temperature dry etching of copper using a new chemical approach", Microelectronic Engineering, Nov. 1997, pp. 121-126, vols. 37-38.

W.H. Lee et al., "Taper Etching of Copper Using an Inductively Coupled O2 Plasma and Hexafluoroacetylacetone", Journal of the Korean Physical Society, Jan. 2002, pp. 152-155, vol. 40, No. 1.

Y. Lgarashi et al., "Sub-quarter micron copper interconnects through dry etching process and its reliability", Symposium on VLSI Technology Digest of Technical Papers, 1994, pp. 57-57.

Yue Kuo et al., "A new, room-temperature, high-rate plasma-based copper etch process", Vacuum 74, 2004, doi:10.1016/j.vacuum.2004.01.072, pp. 473-477.

Yue Kuo et al., "A Novel Plasma-Based Copper Dry Etching Method", Japanese Journal of Applied Physics, 2000, pp. 188-L 190, vol. 39, Part 2, No. 3A/B.

* cited by examiner

| $HCl:H_2=60:0$ | $HCl:H_2=55:5$ |
|---|---|
|  |  |
| $HCl:H_2=50:10$ | $HCl:H_2=40:20$ |
|  |  |

…

COPPER PLASMA ETCHING METHOD AND MANUFACTURING METHOD OF DISPLAY PANEL

CROSS-REFERENCE TO RELATED APPLICATION

This application claims priority to and the benefit of Korean Patent Application No. 10-2017-0127794 filed in the Korean Intellectual Property Office on Sep. 29, 2017, and all the benefits accruing therefrom under 35 U.S.C. § 119, the entire contents of which are incorporated herein by reference.

BACKGROUND

(a) Field

This disclosure relates to a copper plasma etching method, and a method for manufacturing an electronic device such as a display panel by using copper-plasma etching.

(b) Description of the Related Art

In manufacturing of an electronic device such as a display device, a semiconductor device, and the like, high resolution and high density circuits may be required. In order to form high resolution and high density circuits, a wire that forms the circuit may need to be narrowed, and accordingly, copper having high conductivity may be advantageous. Thus, an etching process for controlling etching uniformity, forming a good profile, having precise critical dimensions (CD), and the like of the copper wire may be required. However, a typical wet-etching process may have difficulty in controlling precise critical dimensions in forming of a copper wire having a width of, for example, about 2 micrometers (μm) or less.

The above information disclosed in this Background section is only for enhancement of understanding of the background of the invention and therefore it may contain information that does not form the prior art that is already known in this country to a person of ordinary skill in the art.

SUMMARY

The embodiments provide an improved copper plasma etching method, and a method for manufacturing an electronic device.

A copper plasma etching method includes: placing a substrate that comprises a conductor layer comprising copper on a susceptor in a process chamber of a plasma etching apparatus; supplying an etching gas that include hydrogen chloride into the process chamber; plasma-etching the conductor layer that include copper on the substrate; and maintaining a temperature of the susceptor at about 10° C. or less during the plasma-etching.

The plasma-etching may include the following reaction stages:

1st reaction stage: 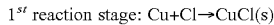 Cu+Cl→CuCl(s)

2nd reaction stage: 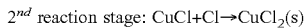 CuCl+Cl→CuCl$_2$(s)

3rd reaction stage: 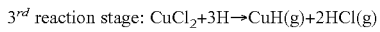 CuCl$_2$+3H→CuH(g)+2HCl(g)

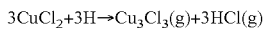 3CuCl$_2$+3H→Cu$_3$Cl$_3$(g)+3HCl(g)

 3CuCl$_2$+3/2H$_2$→Cu$_3$Cl$_3$(g)+3HCl(g).

In the plasma-etching, the number of hydrogen radicals may be greater than or equal to the number of chlorine radicals.

The etching gas may further include H$_2$ gas.

A flow rate ratio of the H$_2$ gas with respect to hydrogen chloride may be about 0.5 or less.

The plasma-etching may be performed using plasma formed by an electron cyclotron resonance (ECR) plasma source.

In the plasma-etching, reactive ion etching may be applied.

The plasma-etching may be performed at a process pressure of about $10^{-2}$ Torr to about $10^{-4}$ Torr.

In the plasma-etching, a photoresist mask may be used as an etching mask.

A display panel manufacturing method includes: forming a conductive layer that includes copper on a substrate; placing a substrate on which the conductive layer is formed on a susceptor in a process chamber of a plasma etching apparatus; plasma-etching the conductive layer; and maintaining a temperature of the susceptor at about 10° C. or lower during the plasma-etching.

The plasma-etching of the conductive layer may include forming a gate line and a gate electrode.

The plasma-etching of the conductive layer may include forming a data line, a source electrode, and a drain electrode.

The substrate may be a plastic substrate.

Copper may be dry-etched without additionally using energy such as heat energy, light energy, plasma energy, and the like. In addition, deposition of a by-product in an etching apparatus may be prevented during etching of copper, critical dimensions may be precisely controlled, and process stability may be improved. Further, there are several beneficial effects that may be appreciated throughout the specification.

BRIEF DESCRIPTION OF THE DRAWINGS

The above and other advantages and features of this disclosure will become more apparent by describing in further detail exemplary embodiments thereof with reference to the accompanying drawings.

DETAILED DESCRIPTION

Figure 1:
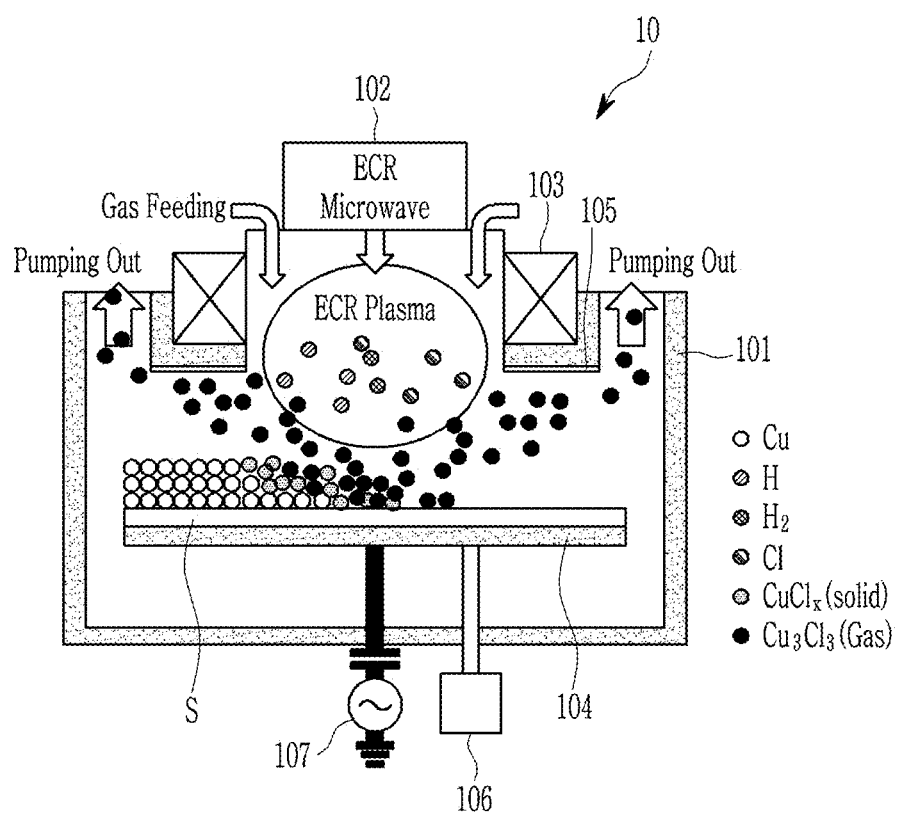
FIG. 1 is a schematic diagram of a plasma etching apparatus according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Further, in this specification, unless explicitly described to the contrary, the phrase "on a plane" means viewing a target portion from the top, and the phrase "on a cross-section" means viewing a cross-section formed by vertically cutting a target portion from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In dry-etching of copper (Cu), a halogen-group gas including fluorine (F) or chlorine (Cl) may be desirable, and a mixture gas containing hydrogen (H), nitrogen (N), helium (He), argon (Ar), and the like may be used as necessary. When a mixture gas containing chlorine is used, chlorine ions and radicals are formed by using plasma and then reacted with copper such that a reactant such as copper (I) chloride (CuCl) or copper (II) chloride ($CuCl_2$) may be formed. Under typical conditions, the reactant may stay in a liquid phase or a solid phase, and therefore copper may be etched through evaporation by applying additional energy (e.g., heat energy, light energy, plasma energy, and the like).

An evaporation point of CuCl or $CuCl_2$ is about 1000° C. under normal pressure, and is about 150° C. in a vacuum of about $10^{-2}$ to $10^{-4}$ Torr, which may be a typical pressure of an etching apparatus that uses a plasma source. Thus, when a thermal method is used, CuCl or $CuCl_2$ is heated to about 200° C. or higher to fully etch CuCl or $CuCl_2$ such that no residue remains. When an optical method is used, the etching apparatus may vaporize copper by irradiating a radiation beam having energy of about 2.2 electronvolts (eV) or greater to CuCl or $CuCl_2$ by using a UV source. However, vaporized CuCl or $CuCl_2$ in the form of a solid may be redeposited on an interior surface of a substrate or a chamber when energy is exhausted because of contact with the interior surface of the chamber when the vaporized CuCl or $CuCl_2$ is discharged to the outside of the chamber. When the redeposition is continued, an exhaust condition for maintaining the vacuum state may be changed, and when the redeposition is significantly increased, a pipe may become clogged and the plasma may not be maintained. In addition, etching by-products redeposited to the chamber may form particles, thereby interrupting etching. Further, the etching by-products may contaminate the substrate, thereby deteriorating quality of a product or reducing the yield.

In order to solve such problems, according to an exemplary embodiment, a process condition that effectively converts CuCl or $CuCl_2$, which is a chlorine reactant, into CuH and $Cu_3Cl_3$, which may be vaporized at room temperature is provided. For example, a temperature of a susceptor (also referred to as a susceptor electrode or a lower electrode) on which a substrate is placed is maintained to be lower than a temperature of other constituent elements of the etching apparatus to thereby etch copper without causing the above-stated problems.

According to an exemplary embodiment, an apparatus for dry-etching copper without using an additional energy source for vaporization of an etching by-product, and a method thereof, are provided. High-density plasma is formed as an electron cyclotron resonance (ECR) plasma source, and chlorine (Cl) and hydrogen (H) are continuously supplied with the same ratio by using hydrogen chloride as etching gas such that CuH and $Cu_3Cl_3$ which are in a gas phase at room temperature are generated. Optionally, $H_2$ gas is added to the etching gas to increase hydrogen (H) radical density to thereby increase process stability and accelerate reaction speed for generation of CuH and $Cu_3Cl_3$. A flow rate ratio ($H_2$/HCl) of the $H_2$ gas with respect to the hydrogen chloride may be, for example, 1 or less or 0.2 or less.

Figure 2:
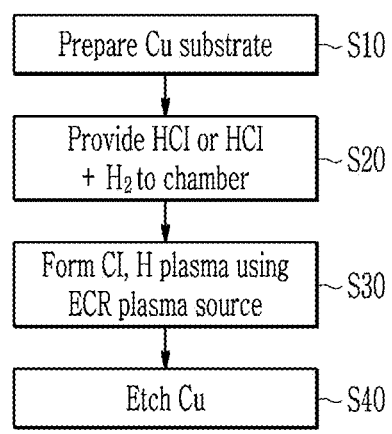
FIG. 2 is a flowchart of the copper plasma etching method according to an exemplary embodiment.
Figure 3:
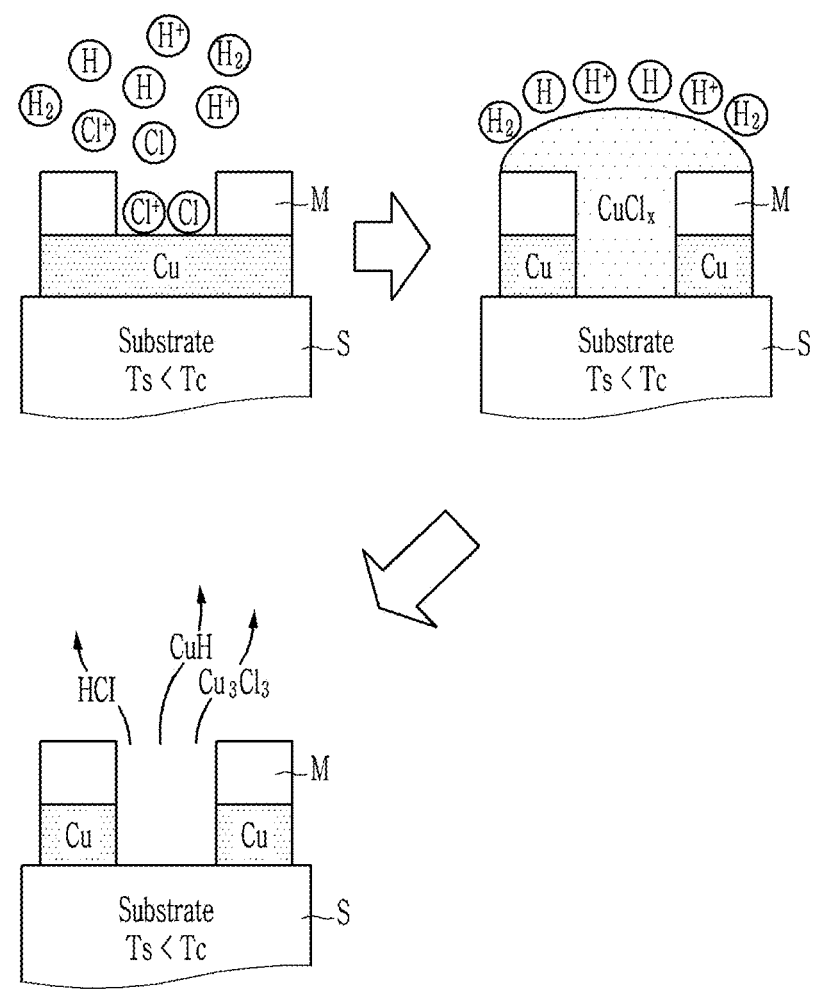
FIG. 3 is a schematic diagram of the copper plasma etching process according to an exemplary embodiment.

FIG. 1 is a schematic diagram of a plasma etching apparatus according to an exemplary embodiment, FIG. 2 is a flowchart of a copper plasma etching method according to an exemplary embodiment, and FIG. 3 is a schematic diagram of a copper plasma etching process according to an exemplary embodiment.

Referring to FIG. 1, a plasma etching apparatus 10 includes a process chamber 101, a microwave generator 102 that generates microwaves, and a magnetic field generator 103 that includes magnetic coils for generation of a magnetic field. In addition, the plasma etching apparatus 10 includes a susceptor 104 on which a substrate S is placed in the process chamber 101, a cooling device 106, and a radio frequency (RF) generator 107. Although not illustrated, the plasma etching apparatus 10 includes a gas injection device for injection of gas into the process chamber 101 and an exhaust device that may exhaust gas (i.e., gas generated during etching) from the process chamber 101 and control a pressure in the process chamber 101. The plasma etching apparatus 10 may include several devices for control and operation or may be connected to such devices. The exemplary plasma etching apparatus 10 may be variously modified as may be determined by a person skilled in the art.

The plasma etching apparatus 10 simultaneously uses an electric field and a magnetic field to form high-density plasma having a high plasma electron temperature, and may be called an ECR etching apparatus or an ECR plasma generator. When a microwave generated using the microwave generator 102 has a frequency that matches an electron gyrofrequency of a magnetic field generated using the magnetic field generator 103, electron cyclotron resonance occurs in the magnetic field in the process chamber 101. When gas is injected into such an ECR region, the gas is ionized such that plasma is formed and electrons in the plasma are accelerated due to the resonance while passing through the region so that high energy may be acquired, e.g., achieved, and a gas ionization rate is increased because a diffusion loss is reduced due to magnetic field so that high-density plasma having a high plasma electron temperature may be generated.

FIG. 2 shows a process for etching copper using the plasma etching apparatus 10 as shown in FIG. 1.

Referring to FIG. 1 and FIG. 2, a substrate S to be etched is prepared (510). The substrate S may be any substrate that is appropriate to be etched, for example, a silicon substrate such as a wafer, a display substrate, a solar substrate, and the like. A copper layer on which a circuit that includes a wire, an electrode, and the like or an electrode is going to be formed by being etched is formed in the substrate S, and a mask may be formed or placed on the copper layer. The mask may define a portion to be etched in the copper layer. The mask may be a hard mask formed of a silicon oxide and the like, or may be formed of a photoresist. In addition to the copper layer, one or more layers to be patterned or not to be patterned may be included in the substrate S. The at least one layer may be any layer that is appropriate for a specific device. The prepared substrate S is placed on the susceptor 104 in the process chamber 101.

After the substrate S is placed on the susceptor 104 in the process chamber 101, hydrogen chloride, or hydrogen chloride and $H_2$ gas, are supplied into the process chamber 101 (S20). The hydrogen chloride, or the hydrogen chloride and the $H_2$ gas, are used as a process gas or an etching gas for etching copper. Next, chlorine plasma and hydrogen plasma are formed from the process gas by using an ECR plasma source (S30). The ECR plasma source may be supplied using the microwave generator 102 and the magnetic field generator 103.

The copper layer of the substrate S is etched corresponding to patterns of the mask using the chlorine (Cl) plasma and the hydrogen (H) plasma (S40). The etching may be carried out through the following three stage reactions.

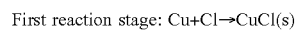
First reaction stage: Cu+Cl→CuCl(s)

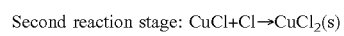
Second reaction stage: CuCl+Cl→$CuCl_2$(s)

Third reaction stage: $CuCl_2$+3H→CuH(g)+2HCl(g)

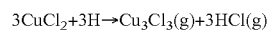
$3CuCl_2$+3H→$Cu_3Cl_3$(g)+3HCl(g)

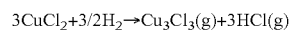
$3CuCl_2$+3/2$H_2$→$Cu_3Cl_3$(g)+3HCl(g)

CuCl and $CuCl_2$ generated in the first and second reaction stages are non-volatile materials at room temperature and are vaporized when heat of about 150° C. or greater is applied at about $10^{-2}$ to $10^{-4}$ Torr, which may be a process pressure of the plasma etching apparatus 10. However, since heat is generated from generation of CuCl and $CuCl_2$ through reaction between copper and chlorine and an internal temperature of the process chamber 101 is increased due to energy from plasma, CuCl and $CuCl_2$ may be partially vaporized without additional heat supply. Thus, when the copper is etched, vaporization of CuCl and $CuCl_2$ may need to be suppressed in order to redeposit CuCl and $CuCl_2$ in the process chamber 101 when copper is etched. A temperature increase of the substrate S may be suppressed, and the temperature of the substrate S may be controlled through the susceptor 104. Since the substrate S is placed on the susceptor 104, the temperature of the substrate S may be approximately the same as or similar to a temperature Ts of the susceptor 104.

For the temperature control of the substrate S, the temperature Ts of the susceptor 104 on which the substrate S is placed may be set to be the lowest in the entire configuration of the plasma etching apparatus 10, for example, in the process chamber 101 and the configuration in the process chamber 101. During the etching process, the temperature Ts of the susceptor 104 may be maintained to be lower than an interior wall temperature Tc of the process chamber 101. The interior wall temperature Tc of the process chamber 101 may be higher than room temperature, and the temperature Ts of the susceptor 104 may be lower than room temperature. According to an exemplary embodiment, the temperature Ts of the susceptor 104 may be maintained at a temperature that is lower than the interior wall temperature Tc of the process chamber 101, for example, about 10° C. or less. Although the interior wall temperature Tc of the process chamber 101 is decreased to be lower than the evaporation point of CuCl and $CuCl_2$, for example, to about 100° C., heat energy or ion bombardment in the plasma is dispersed and therefore the substrate S may be locally heated to vaporize CuCl and $CuCl_2$ with respect to particles having high energy. When the temperature Ts of the susceptor 104 is sufficiently decreased, for example, to less than about 10° C., the entire substrate S may be maintained at a temperature that is lower than the evaporation point of CuCl and $CuCl_2$.

It may be advantageous when the temperature of the susceptor 104 is as low as possible, but if the temperature is too low, a process error may occur due to condensation in the plasma etching apparatus 10. Thus, the temperature Ts of the susceptor 104 may be higher than the temperature that causes the condensation. For example, the temperature Ts may be higher than about −50° C. The temperature Ts of the susceptor 104 may be controlled using the cooling device 106 connected to the susceptor 104, and for example, the temperature Ts of the susceptor 104 may be set to a predetermined temperature by circulating a coolant to the susceptor 104.

While the temperature Ts of the susceptor 104 is maintained at a sufficiently low level of less than about 10° C. (i.e., Ts<Tc), the etching reaction of the third reaction stage is performed to effectively generate CuH and $Cu_3Cl_3$.

Referring to FIG. 3, CuCl is formed through reaction of copper (Cu) and chlorine (Cl) radicals, and chlorine is continuously supplied for additional reaction of CuCl and chlorine radicals in the second reaction stage such that copper in a portion (i.e., a portion not covered with the mask M) to be etched in the copper layer is saturated with $CuCl_2$. In the third reaction stage, CuH and $Cu_3Cl_3$, which are materials that are maintained in a gaseous state at room temperature and normal pressure from reaction of $CuCl_2$ and hydrogen radicals and then vaporized, completely etch the copper. Hydrogen chloride (HCl) is also generated in the third reaction stage, and the hydrogen chloride is split into hydrogen radicals and chlorine radicals by a plasma source and thus is reused in a copper etching process. $Cu_3Cl_3$ is not split since it has material stability, and thus may be discharged to the outside of the process chamber 101 in a gaseous state.

In order to continuously maintain the etching reaction of the third reaction stage, hydrogen ions and radicals may be supplied in an equal or greater amount than chloride ions and radicals.

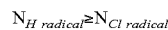

$$N_{H\ radical} \geq N_{Cl\ radical}$$

According to an exemplary embodiment, hydrogen chloride gas is used as the etching gas. Hydrogen chloride is split by using an ECR plasma source so that hydrogen radicals and chloride radicals may be generated with the same ratio. Additionally, $H_2$ gas is supplied to increase the number of hydrogen radicals. When $H_2$ radicals that are not decomposed into the hydrogen radicals react with $CuCl_2$ and thus $Cu_3Cl_3$ is formed, heat absorption occurs so that a temperature of the substrate S that is placed on the susceptor 104 may be decreased. Thus, supply of the $H_2$ gas may suppress vaporization of an unnecessary CuCl and $CuCl_2$ reactant and improve process stability.

When the ECR plasma source is used in the etching process, it may be advantageous in the process because the ECR plasma source includes high-density plasma, for example, about $10^{11}/cm^3$ or greater and high energy, for example, about 1 eV to about 10 eV compared to an inductively coupled plasma (ICP) source or a capacitively coupled plasma (CCP). Since $H_2$ has a high energy bond of about 4.52 eV at room temperature, the ECR plasma source may be desirable to effectively form hydrogen radicals. As described above, the microwave generator 102 and the magnetic field generator 103 of the plasma etching apparatus 10 may be used as the ECR plasma source.

Figure 4:
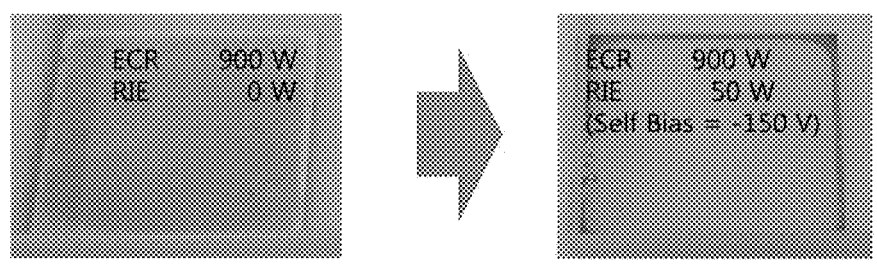
FIG. 4 is a photograph that shows etching results depending on whether or not reactive ion etching is applied.

FIG. 4 is a photograph that shows etching results depending on application of reactive ion etching.

In FIG. 4, the left drawing is a photograph that shows a copper layer sample etched by using an ECR plasma source having power of 900 watts (W), and the right drawing is a photograph that shows a copper layer sample etched by applying reactive ion etching (RIE) having a −150 volts (V) self-bias, together with the ECR plasma source having power of 900 W. When the RIE mode is combined to, e.g., used on, the susceptor 104, ion reaction is added such that anisotropic etching may be improved. The reactive ion etching may be performed by, for example, applying a radio frequency to the susceptor 104 by using the RF generator 107.

Figure 5:
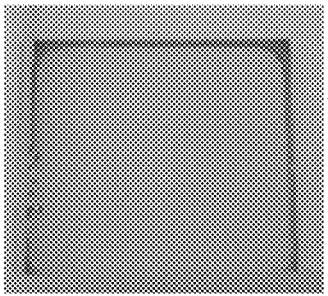
FIG. 5 a photograph that shows etching results according to a flow rate ratio of hydrogen chloride and H$_2$ gas.
Figure 5:
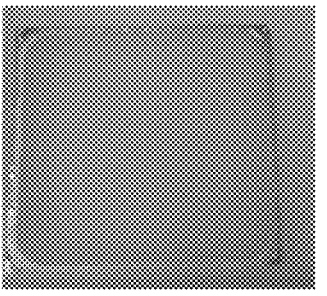
Figure 5:
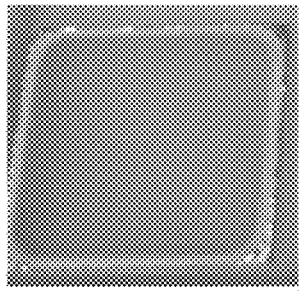
Figure 5:
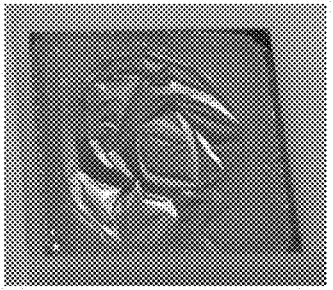
Figure 6:
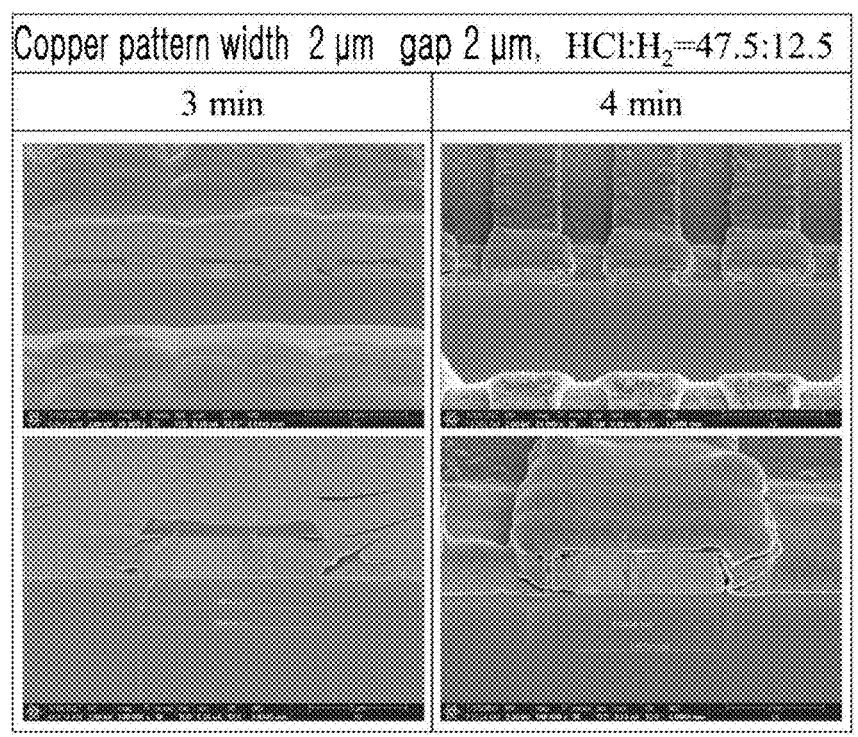
FIG. 6 is an electron microscope photograph that shows etching results when a flow rate ratio of hydrogen chloride to H$_2$ gas is 47.5:12.5.

FIG. 5 is a photograph that shows etching results according to a flow rate ratio of hydrogen chloride and $H_2$ gas, and FIG. 6 is a scanning electron microscope photograph that shows etching results when the flow rate ratio of hydrogen chloride and $H_2$ gas is 47.5:12.5.

When the number of hydrogen radicals is too large, a long time may be required for $CuCl_2$ to reach a saturation state, and etching may be interrupted. Thus, it may be advantageous to use an appropriate ratio. In order to acquire, e.g., achieve, etching results according to a gas ratio, ECR power was set to 900 W, RIE was set to 50 W (−150 V), a gap between a plasma source and a substrate (corresponding to a gap between an opposing electrode 105 and the substrate S in FIG. 1) was set to 1 centimeter (cm), and processing time was set to 300 seconds, and the copper layer was etched while adjusting the gas ratio by adjusting a flow rate of hydrogen chloride and $H_2$ gas. FIG. 5 shows some of the etching results.

The etching rate is decreased as the flow rate ratio of $H_2$ gas is increased, and when the flow rate ratio of HCl:$H_2$ becomes 40:20, the copper layer is not etched within 300 seconds, and various and effective copper etching rates and various copper micropatterns may be acquired, e.g., achieved, when the flow rate ratio ($H_2$/HCl) of $H_2$ with respect to hydrogen chloride is between 0 and 0.5. When the flow rate ratio ($H_2$/HCl) exceeds 0.5, an etching time is rapidly increased, which may be caused due to an insufficient amount of chlorine radicals. When the flow rate ratio ($H_2$/HCl) exceeds 1, a $CuCl_x$ layer is not sufficiently formed, thereby interrupting etching.

In addition, when the flow rate ratio of HCl:$H_2$ was 47.5:12.5, copper etching critical dimensions (CD) may be precisely controlled as shown in FIG. 6. That is, when the flow rate ratio ($H_2$/HCl) was about 0.263, a copper layer having a thickness of about 5000 angstroms (Å) and a width of about 1 nanometers (nm) to about 2 nm was able to be micropatterned with a high etching rate of about 300 nanometers per minute (nm/min). Thus, when the etching rate and the etching critical dimension are considered together, it may be advantageous when the flow rate ratio ($H_2$/HCl) is about 0.263 or less (i.e., when a flow rate ratio (HCl/$H_2$) of HCl with respect to $H_2$ was about 3.8 or more). In a process aspect, it may be advantageous when a total flow amount of the etching gas is increased according to a substrate size, a pattern design, and a process environment, and for example, the total flow amount may be increased to about 100 cubic centimeters per minute (sccm), and the flow rate ratio of hydrogen chloride may be changed depending on process conditions.

Figure 7:
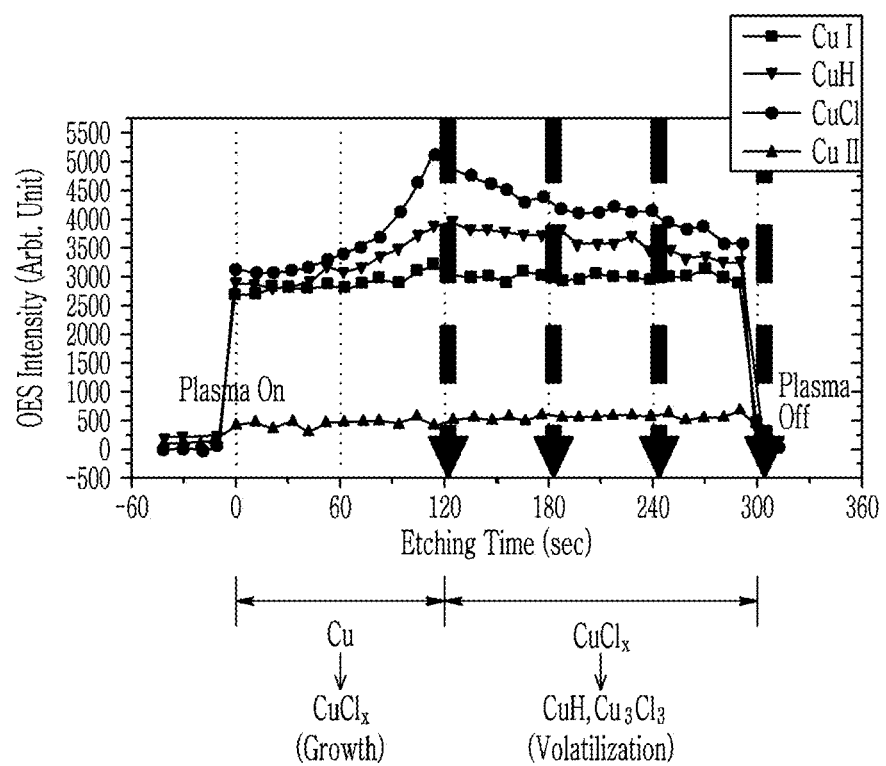
FIG. 7 is a graph that shows optical emission spectroscopy (OES) intensity according to etching time.
Figure 8:
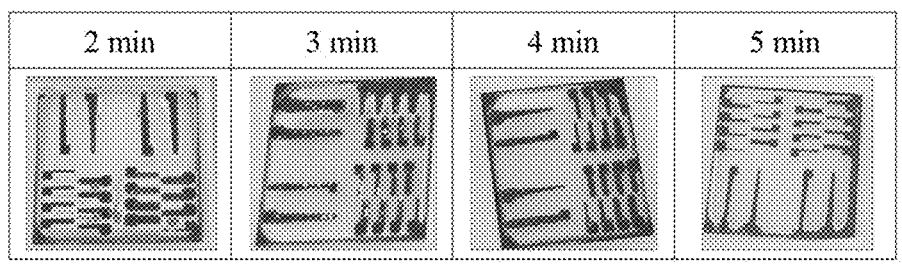
FIG. 8 is a photograph that shows etching results according to etching time.

FIG. 7 is a graph that shows OES intensity according to an etching time, and FIG. 8 is a photograph that shows etching results according to the etching time.

The above-stated third stage etching reaction may be confirmed from optical emission spectroscopy (OES) data and copper etching results according to the etching time. As the process conditions, the ECR power was set to 900 W, RIE was set to 50 W (−150 V), a gap between the plasma source and the substrate was set to 1 cm, the flow rate ratio of HCl:$H_2$ was set to 47.5:12.5, and the etching times were set to 120 seconds (s), 180 s, 240 s, and 300 s, and the etching results were compared. As shown in FIG. 7, from the moment that the plasma is turned on, intensity of $CuCl_x$ is increased the fastest by radical reaction of copper and chlorine such that the intensity reaches the peak value at 120 seconds. In this case, it may be observed that the growth of $CuCl_x$ reaches a saturation state and then is vaporized to CuH or $Cu_3Cl_3$ by reacting with hydrogen radicals such that the intensity of $CuCl_x$ is decreased. Through this experiment, the third stage etching reaction according to an exemplary embodiment may be verified.

According to an exemplary embodiment, the etching apparatus and the etching method that may etch copper without an additional energy source at room temperature may be provided. High-density plasma is formed by using the ECR plasma source, and HCl is used as an etching gas such that chlorine and hydrogen may be continuously supplied with the same ratio. Selectively, $H_2$ gas is added to increase density of the hydrogen radicals to thereby increase process stability, and the process for forming the $Cu_3Cl_3$ and CuH reactant having a gaseous state at room temperature and normal pressure may be accelerated through the etching reaction of the third reaction.

Referring back to FIG. 1, the temperature Ts of the susceptor 104 on which the substrate S on which the previously described reaction occurs is placed is maintained to be significantly lower than temperatures of other constituent elements of the etching apparatus 10 (e.g., Ts<Tc) to suppress evaporation of a non-volatile etching by-product, thereby stably maintaining the process. However, unlike a typical method in which copper is etched by increasing a temperature of the substrate S, according to an exemplary embodiment, copper may be etched with precise critical dimensions while maintaining the temperature Ts of the susceptor 104 at about 10° C. or less to suppress evaporation of CuCl and $CuCl_2$. The temperature Ts of the susceptor 104 is decreased to the lowest in the entire configuration of the etching apparatus 10 such that the temperature of the substrate S may be decreased.

For the copper etching reaction of the third reaction, it may be advantageous to supply the number of hydrogen radicals to be equal to or greater than the number of chlorine radicals. Thus, the $H_2$ gas may be added to the hydrogen chloride, which is an etching gas, and $H_2$ and $CuCl_2$ are chemically reacted such that heat absorption occurs. When copper is etched by forming hydrogen radicals and chlorine radicals only using hydrogen chloride gas, there may be restrictions in some cases. For example, a certain portion in the process chamber 101 may be temporarily excessively heated due to heat generated from the process of forming CuCl and $CuCl_2$ and plasma heat. Although the temperature Ts of the susceptor 104 is maintained to be less than about 10° C. in order to decrease the temperature of the substrate S, excessively high heat may be applied to the copper layer of the substrate or a mask formed on the copper layer. When the mask is a photo-resist or the substrate S is formed of plastic (e.g., an organic polymer), the mask or the substrate S may be damaged due to the momentary high heat. When $H_2$ is supplied, $H_2$ and $CuCl_2$ react with each other such that $Cu_3Cl_3$ is formed while causing heat absorption, and then the internal temperature of the process chamber 101 may be decreased, thereby suppressing evaporation of CuCl and $CuCl_2$ and releasing or removing process restrictions.

Hereinafter, a display panel that is one of various electronic devices and electronic parts on which the above-described etching method may be applied will be described. The etching methods may be used in manufacturing of a display panel such as an organic light emitting display panel, a liquid crystal display panel, and the like.

Figure 9:
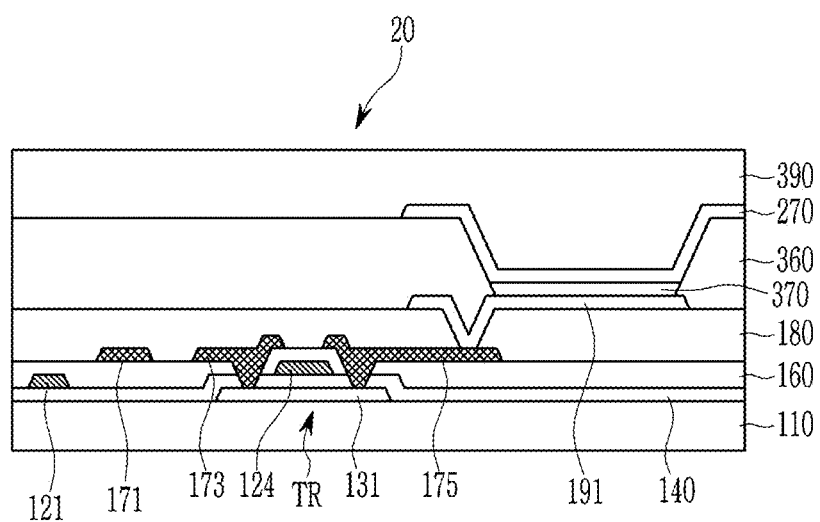
FIG. 9 is a schematic cross-sectional view of an organic light emitting display panel according to an exemplary embodiment.
Figure 10:
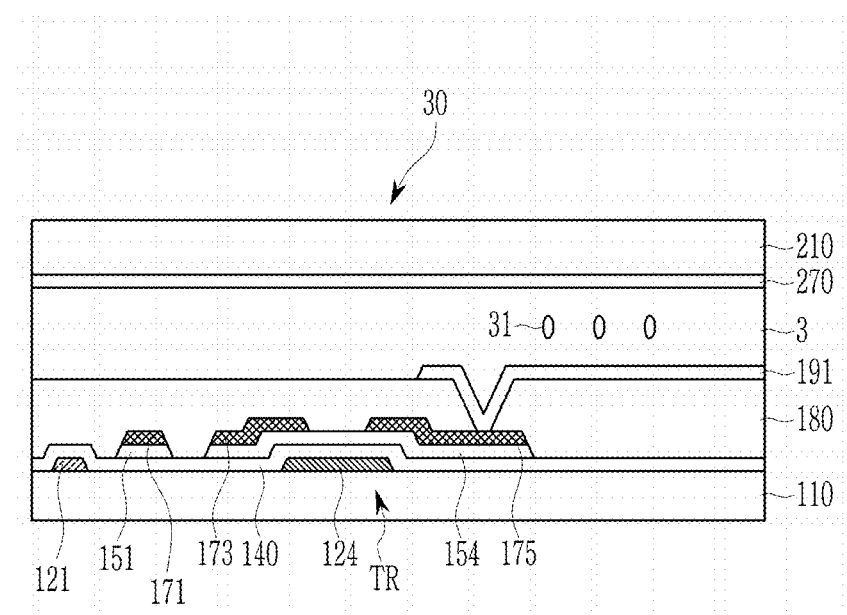
FIG. 10 is a schematic cross-sectional view of a liquid crystal display panel according to an exemplary embodiment.

FIG. 9 is a schematic cross-sectional view of an organic light emitting display panel according to an exemplary embodiment, and FIG. 10 is a schematic cross-sectional view of a liquid crystal display panel according to an exemplary embodiment.

As will be appreciated by those of ordinary skill in the art, the display panel may include various configurations other than the configurations shown. First, an organic light emitting display panel will be described, and a liquid crystal display panel will be described with a focus on differences therefrom.

Referring to FIG. 9, a display panel 20 includes a substrate 110, and signal lines and elements that are formed of several layers on the substrate 110.

The substrate 110 may be a flexible substrate formed of a plastic (e.g., a polymer) film. For example, the substrate 110 may be formed of a polymer such as polyimide, polyamide, polyester such as polyethylene terephthalate, and the like. The substrate 110 may be a hard substrate made of glass or silicon.

The substrate 110 may include a barrier layer (not shown) that prevents dispersion of an impurity that deteriorates a semiconductor characteristic and prevents permeation of moisture and the like.

A semiconductor 131 of a transistor TR is positioned on the substrate 110, and a gate insulating layer 140 is positioned on the semiconductor 131. The semiconductor 131 includes a source region and a drain region, and a channel region that is disposed between the source region and the drain region. The semiconductor 131 may include polysilicon, an oxide semiconductor, or amorphous silicon. The gate insulating layer 140 may be formed by depositing an inorganic insulating material such as a silicon oxide, a silicon nitride, and the like.

A gate conductor that includes a gate line 121 and a gate electrode 124 of the transistor TR is positioned on the gate insulating layer 140. The gate conductor may be formed by depositing a conductive material such as copper (Cu), aluminum (Al), silver (Ag), molybdenum (Mo), chromium (Cr), tantalum (Ta), titanium (Ti), and the like on the substrate 110 and patterning the same.

When copper is used as the gate conductor, a copper layer is formed by sputtering, as an example, on the substrate 110. Next, a mask is formed or disposed on the copper layer and then etched by using the copper plasma etching method according to an above-described exemplary embodiment such that the gate conductor, which is a patterned copper layer, is formed. When the copper layer is etched, a temperature of a susceptor on which the substrate 110 is placed is maintained at about 10° C. or less to thereby decrease a temperature of the substrate 110, and $H_2$ additionally supplied to an etching gas reacts with $CuCl_2$ while causing heat absorption so that the temperature of the substrate 110 may be decreased, and accordingly, a photoresist that may be vulnerable to heat may be used as a mask. In addition, since the substrate 110 is maintained at a low temperature, the substrate 110 is not damaged during dry-etching of the copper layer even if, for example, a plastic substrate is used.

An interlayer insulating layer 160 is positioned on the gate conductor. The interlayer insulating layer 160 may include an inorganic insulating material. A data conductor that includes a data line 171, and a source electrode 173 and a drain electrode 175 of the transistor TR, is disposed on the interlayer insulating layer 160. The source electrode 173 and the drain electrode 175 are respectively connected with the source region and the drain region of the semiconductor 131 through contact holes formed in the interlayer insulating layer 160 and the gate insulating layer 140. The data conductor may include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy. When copper is used as the data conductor, the data conductor may be formed by etching a copper layer in the same manner as in the above-described case of using copper as the gate conductor.

A planarization layer 180 may be positioned on the source electrode 173 and the drain electrode 175. The planarization layer 180 may include an organic insulating material or an inorganic insulating material.

A pixel electrode 191 is positioned on the planarization layer 180. The pixel electrode 191 is connected with the drain electrode 175 through a contact hole formed in the planarization layer 180, and receives a data signal therefrom. A portion including layers from the substrate 110 to the pixel electrode 191 may be called a transistor display panel or a thin film transistor display panel.

A pixel defining layer 360 is positioned on the planarization layer 180. The pixel defining layer 360 includes an opening that overlaps the pixel electrode 191. An emission layer 370 is positioned on the pixel electrode 191 in the opening of the pixel defining layer 360, and a common electrode 270 is positioned on the emission layer 370. The pixel electrode 191, the emission layer 370, and the common electrode 270 form an organic light emitting diode (OLED). The pixel electrode 191 may be an anode of the organic light emitting diode, and the common electrode 270 may be a cathode of the organic light emitting diode. The common electrode 270 may include a transparent conductive material such as an indium tin oxide (ITO), an indium zinc oxide (IZO), and the like. An encapsulation layer 390 that protects the organic light emitting diode is positioned on the common electrode 270.

Referring to FIG. 10 in relation to a liquid crystal display panel 30, a gate line 121 and a gate electrode 124 of a transistor TR are positioned on a substrate 110, and a gate insulating layer 140 is positioned on the gate line 121 and the gate electrode 124. A semiconductor 151 and a semiconductor 154 of the transistor TR are positioned on the gate insulating layer 140, a data line 171 is positioned on the semiconductor 151, and a source electrode 173 and a drain electrode 175 are positioned on the semiconductor 154.

When a gate conductor that includes the gate line 121 and the gate electrode 124 is formed of copper, a copper layer is formed on the substrate 110 and etched by using the copper plasma etching method according to an above-described exemplary embodiment such that the gate conductor, which is a patterned copper layer, is formed. When a data conductor that includes the data line 171, the source electrode 173, and the drain electrode 175 is formed of copper, a copper layer is formed on the substrate 110 and etched by using the copper plasma etching method according to an above-described exemplary embodiment, such that the data conductor, which is a patterned copper layer, is formed.

A planarization layer 180 is positioned on the data conductor, and a pixel electrode 191 is positioned on the planarization layer 180. The pixel electrode 191 is connected with the drain electrode 175 through a contact hole formed in the planarization layer 180, and receives a data signal therefrom. A portion including layers from the substrate 110 to the pixel electrode 191 may be called a transistor display panel or a thin film transistor display panel.

A liquid crystal layer 3 that includes liquid crystal molecules 31 is positioned on the pixel electrode 191, and an insulating layer 210 that seals the liquid crystal layer 3 together with the substrate 110 is positioned on the liquid crystal layer 3. The insulating layer 210 may be in the form of a substrate. The liquid crystal molecules 31 may be disposed apart from each other in microcavities.

A common electrode 270 is disposed below the insulating layer 210 to generate an electric field in the liquid crystal layer 3 together with the pixel electrode 191, thereby controlling an alignment direction of the liquid crystal molecules 31. An alignment layer (not shown) may be disposed between the pixel electrode 191 and the liquid crystal layer 3 and between the liquid crystal layer 3 and the common electrode 270. The common electrode 270 may be disposed between the substrate 110 and the liquid crystal layer 3.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A copper plasma etching method comprising:
   placing a substrate comprising a copper layer on a susceptor in a process chamber of a plasma etching apparatus;
   supplying an etching gas that comprises hydrogen chloride into the process chamber;
   plasma-etching the copper layer on the substrate; and
   maintaining a temperature of the susceptor at less than about 10° C. during the plasma-etching,
   wherein the etching gas further comprises $H_2$ gas, and
   wherein a flow rate ratio of the $H_2$ gas with respect to hydrogen chloride is about 0.5:1 or less, and
   wherein the plasma-etching is performed for about 120 seconds to about 300 seconds.

2. The copper plasma etching method of claim 1, wherein, in the plasma-etching, a number of hydrogen radicals is greater than or equal to a number of chlorine radicals.

3. The copper plasma etching method of claim 1, wherein the plasma-etching is performed using plasma formed by an electron cyclotron resonance plasma source.

4. The copper plasma etching method of claim 1, wherein the plasma-etching comprises reactive ion etching.

5. The copper plasma etching method of claim 1, wherein the plasma-etching is performed at a process pressure of about 10−2 Torr to about 10−4 Torr.

6. The copper plasma etching method of claim 1, wherein, in the plasma-etching, a photoresist mask is used as an etching mask.

7. A copper plasma etching method comprising:
   placing a substrate comprising a conductive layer that comprises copper on a susceptor in a process chamber of a plasma etching apparatus;
   supplying an etching gas that comprises hydrogen chloride into the process chamber;
   plasma-etching the conductive layer that comprises copper on the substrate; and
   maintaining a temperature of the susceptor at about 10° C. or less during the plasma-etching,
   wherein the etching gas further comprises H$_2$ gas, and wherein a flow rate ratio of the H$_2$ gas with respect to hydrogen chloride is about 0.5:1 or less,
   wherein the plasma-etching is performed for about 120 seconds to about 300 seconds, and
   wherein the plasma-etching comprises the following reaction stages:

1$^{st}$ reaction stage: Cu+Cl→CuCl(s)

2$^{nd}$ reaction stage: CuCl+Cl→CuCl$_2$(s)

3$^{rd}$ reaction stage: CuCl$_2$+3H→CuH(g)+2HCl(g)

3CuCl$_2$+3H→Cu$_3$Cl$_3$(g)+3HCl(g)

3CuCl$_2$+3/2H$_2$→Cu$_3$Cl$_3$(g)+3HCl(g).

8. The copper plasma etching method of claim 7, wherein, in the plasma-etching, a number of hydrogen radicals is greater than or equal to a number of chlorine radicals.

9. The copper plasma etching method of claim 7, wherein the plasma-etching is performed using plasma formed by an electron cyclotron resonance plasma source.

10. The copper plasma etching method of claim 7, wherein the plasma-etching comprises reactive ion etching.

11. The copper plasma etching method of claim 7, wherein the plasma-etching is performed at a process pressure of about 10' Torr to about 10' Torr.

12. The copper plasma etching method of claim 7, wherein, in the plasma-etching, a photoresist mask is used as an etching mask.

13. A display panel manufacturing method comprising:
    forming a conductive layer that comprises copper on a substrate;
    placing the substrate on which the conductive layer is formed on a susceptor in a process chamber of a plasma etching apparatus;
    supplying an etching gas that comprises hydrogen chloride into the process chamber;
    plasma-etching the conductive layer; and
    maintaining a temperature of the susceptor at about 10° C. or less during the plasma-etching,
    wherein the etching gas further comprises H$_2$ gas, and wherein a flow rate ratio of the H$_2$ gas with respect to hydrogen chloride is about 0.5:1 or less,
    wherein the plasma-etching is performed for about 120 seconds to about 300 seconds, and
    wherein the plasma-etching of the conductive layer comprises forming a data line, a source electrode, and a drain electrode.

14. The display panel manufacturing method of claim 13, wherein the plasma-etching comprises the following reaction stages:

Cu+Cl→CuCl(s)

CuCl+Cl→CuCl$_2$(s)

CuCl$_2$+3H→CuH(g)+2HCl(g)

3CuCl$_2$+3H→Cu$_3$Cl$_3$(g)+3HCl(g)

3CuCl$_2$+3/2H$_2$→Cu$_3$Cl$_3$(g)+3HCl(g)

15. The display panel manufacturing method of claim 13, wherein, in the plasma-etching, a number of hydrogen radicals is greater than or equal to a number of chlorine radicals.

16. The display panel manufacturing method of claim 13, wherein the plasma-etching is performed using plasma formed by an electron cyclotron resonance plasma source.

17. The display panel manufacturing method of claim 13, wherein the plasma-etching comprises reactive ion etching.

18. The display panel manufacturing method of claim 13, wherein the plasma-etching of the conductive layer comprises forming a gate line and a gate electrode.

19. The display panel manufacturing method of claim 13, wherein the plasma-etching is performed at a process pressure of about 10$^{-2}$ Torr to about 10$^{-4}$ Torr.

20. The display panel manufacturing method of claim 13, wherein the substrate comprises a plastic substrate.

* * * * *